US009316665B2

(12) United States Patent
Geisberger et al.

(10) Patent No.: US 9,316,665 B2
(45) Date of Patent: Apr. 19, 2016

(54) ESTIMATION OF SIDEWALL SKEW ANGLES OF A STRUCTURE

(71) Applicant: FREESCALE SEMICONDUCTOR, INC., Austin, TX (US)

(72) Inventors: Aaron A. Geisberger, Austin, TX (US); Kemiao Jia, Phoenix, AZ (US)

(73) Assignee: FREESCALE SEMICONDCUTOR, INC., Austin, TX (US)

( * ) Notice: Subject to any disclaimer, the term of this patent is extended or adjusted under 35 U.S.C. 154(b) by 449 days.

(21) Appl. No.: 13/867,720

(22) Filed: Apr. 22, 2013

(65) Prior Publication Data

US 2014/0311243 A1 Oct. 23, 2014

(51) Int. Cl.

| | |
|---|---|
| ***G01N 3/20*** | (2006.01) |
| ***G01P 15/08*** | (2006.01) |
| ***G01C 19/5656*** | (2012.01) |
| ***G01C 19/5663*** | (2012.01) |
| ***G01C 25/00*** | (2006.01) |
| ***G01B 5/24*** | (2006.01) |
| ***B81C 99/00*** | (2010.01) |

(52) U.S. Cl.

CPC ........... *G01P 15/0888* (2013.01); *B81C 99/004* (2013.01); *G01B 5/24* (2013.01); *G01C 19/5656* (2013.01); *G01C 19/5663* (2013.01); *G01C 25/005* (2013.01); *B81C 2201/0132* (2013.01)

(58) Field of Classification Search

CPC .. G01B 5/24; G01C 19/5656; G01P 15/0888; B81B 3/0037; B81B 3/0051; B81C 99/004; B18B 3/0051

USPC ........................................... 73/760, 777, 849

See application file for complete search history.

(56) References Cited

U.S. PATENT DOCUMENTS

| | | | | |
|---|---|---|---|---|
| 4,034,983 | A * | 7/1977 | Dash | A63F 13/00 463/3 |
| 6,309,077 | B1 | 10/2001 | Saif et al. | |
| 6,571,630 | B1 | 6/2003 | Weinberg et al. | |
| 6,781,744 | B1 | 8/2004 | Aksyuk et al. | |
| 6,785,437 | B2 * | 8/2004 | Hagood | G02B 6/022 385/16 |
| 6,806,991 | B1 | 10/2004 | Sarkar et al. | |
| 6,823,720 | B1 * | 11/2004 | Adkins | G01N 29/022 73/24.06 |
| 7,168,298 | B1 * | 1/2007 | Manginell | G01N 30/08 73/24.06 |
| 2006/0092228 | A1 * | 5/2006 | Silverbrook | B41J 2/14 347/54 |

(Continued)

OTHER PUBLICATIONS

EP Application 14164623.2, Geisberger et al., EP Extended Search Report dated Oct. 9, 2014, pp. 1-8.

(Continued)

*Primary Examiner* — Max Noori

(74) *Attorney, Agent, or Firm* — Charlene R. Jacobsen

(57) ABSTRACT

An apparatus (36) includes a motion amplification structure (52), an actuator (54), and a sense electrode (50) in proximity to the structure (52). The actuator (54) induces an axial force (88) upon the structure (52), which causes a relatively large amount of in-plane motion (108) in one or more beams (58, 60) of the structure (52). When sidewalls (98) of the beams (58, 60) exhibit a skew angle (28), the in-plane motion (108) of the beams (58, 60) produces out-of-plane motion (110) of a paddle element (62) connected to the end of the beams (58, 60). The skew angle (28), which results from an etch process, defines a degree to which the sidewalls (98) of beams (58, 60) are offset or tilted from their design orientation. The out-of-plane motion (110) of element (62) is sensed at the electrode (50), and is utilized to determine an estimated skew angle (126).

16 Claims, 6 Drawing Sheets

(56) References Cited

U.S. PATENT DOCUMENTS

| | | | | |
|---|---|---|---|---|
| 2010/0017923 | A1* | 1/2010 | Pittenger | B82Y 35/00 850/21 |
| 2012/0125101 | A1 | 5/2012 | Seeger et al. | |
| 2015/0089693 | A1* | 3/2015 | Jesse | G01Q 10/045 850/1 |

OTHER PUBLICATIONS

Chu et al., Measurements of Material Properties Using Differential Capacitive Strain Sensors, Journal of Microelectromechanical Systems, vol. 11, No. 5, Oct. 2002, pp. 489-498, 2002 IEEE.

* cited by examiner 52
8
62
90
Z
50
X
58
94
96
Y
60
98
8
92
98
110
108
72
64
88

110
62
52
dC
50
53
114

130
122
20
15
126
dCX vs. θX
10
124
CAPACITANCE CHANGE, dC (fF)
5
0
-5
-10
-15
118
-20
89.7
89.8
89.9
90.0
90.1
90.2
90.3
120
SKEW ANGLE, θ, (CENTERED AT 90°)

ESTIMATION OF SIDEWALL SKEW ANGLES OF A STRUCTURE

TECHNICAL FIELD OF THE INVENTION

The present invention relates generally to microelectromechanical systems (MEMS) devices. More specifically, the present invention relates to the fabrication of MEMS devices that are less susceptible to quadrature error.

BACKGROUND OF THE INVENTION

Microelectromechanical systems (MEMS) technology has achieved wide popularity in recent years, as it provides a way to make very small mechanical structures and integrate these structures with electrical devices on a single substrate using conventional batch semiconductor processing techniques. One common application of MEMS is the design and manufacture of sensor devices. MEMS sensor devices are widely used in applications such as automotive, inertial guidance systems, household appliances, game devices, protection systems for a variety of devices, and many other industrial, scientific, and engineering systems. One example of a MEMS sensor is a MEMS angular rate sensor. An angular rate sensor senses angular speed or velocity around one or more axes. Other MEMS devices may be utilized as actuators, switches, pumps, and so forth.

BRIEF DESCRIPTION OF THE DRAWINGS

A more complete understanding of the present invention may be derived by referring to the detailed description and claims when considered in connection with the Figures, wherein like reference numbers refer to similar items throughout the Figures, the Figures are not necessarily drawn to scale, and:

DETAILED DESCRIPTION

In vibratory microelectromechanical systems (MEMS) angular rate sensors, an inherent problem is the existence of undesirable interference signals, referred to as a quadrature component or quadrature error. Quadrature error can occur in vibrating angular rate sensors due to manufacturing imperfections that permit the suspended mass to oscillate out-of-plane of its intended drive motion. This out-of-plane motion can create an oscillation about the sense axis that can be confused with Coriolis acceleration and subsequently, the rotation rate. Unfortunately, quadrature error can result in offset error, reduced dynamic range, and increased noise for the device. A large quadrature error may even cause a device to rail the electronic circuit due to significant vertical motion, so that in the worst case, the sense mass may come into contact with conductive electrodes potentially resulting in collision-related damage, such as a short.

A major source for quadrature error is from inadequate dimensional precision during manufacturing. For example, off-vertical ion impact from deep reactive ion etch (DRIE) plasma during etching of the MEMS structural layer can produce asymmetrically tilted etch patterns in the sidewalls of the elements formed in the MEMS structural layer. The asymmetrical etch profile can lead to a shift of the principle axis. As such, in-plane motion couples to out-of-plane motion. The out-of-plane motion can be a major contributor to quadrature error in X- and Y-axis angular rate sensors with an out-of-plane sense mode.

Figure 1:
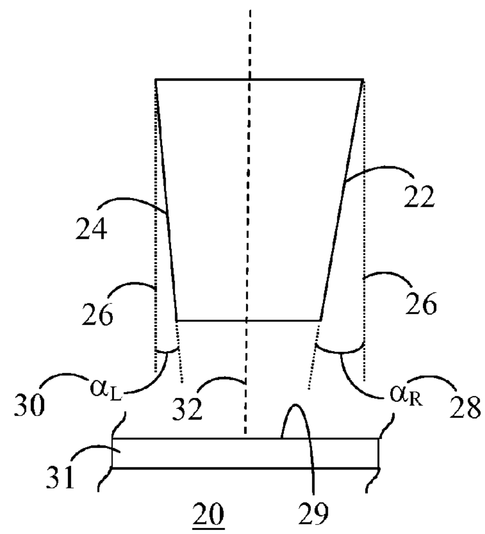
FIG. 1 shows a cross-sectional view of a beam element of a microelectromechanical systems (MEMS) device having asymmetrically tilted sidewalls.
Figure 2:
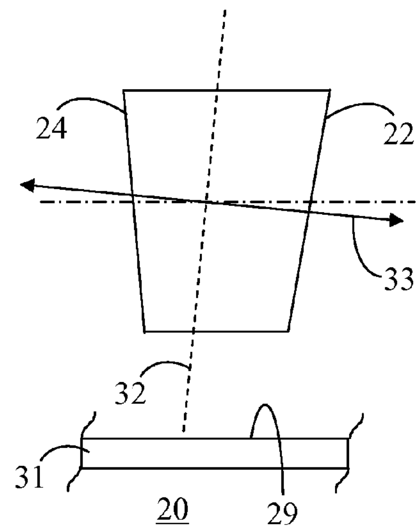
FIG. 2 shows a cross-sectional view of the beam element of FIG. 1 exemplifying its movement in response to the asymmetrically tilted sidewalls.

Referring to FIGS. 1-2, FIG. 1 shows a cross-sectional view of a beam element 20 having asymmetrically tilted sidewalls 22, 24 and FIG. 2 shows a cross-sectional view of beam element 20 exemplifying its movement in response to the asymmetrically tilted sidewalls 22, 24. Sidewalls 22, 24 are tilted away from a design orientation, represented by a dashed line 26. The degree of tilt is referred to as a skew angle, $\alpha$. In the illustration shown in FIG. 1, sidewall 22 tilts inwardly at a skew angle 28, $\alpha_R$, and sidewall 24 tilts inwardly at a skew angle 30, $\alpha_L$. Accordingly, skew angle 28 defines a degree to which sidewall 22 is nonparallel relative to an axis, i.e. dashed line 26, perpendicular to a planar surface 29 of an underlying substrate 31. Likewise, skew angle 30 defines a degree to which sidewall 24 is nonparallel relative to an axis, i.e. dashed line 26, perpendicular to planar surface 29 of the underlying substrate 31.

Skew angle 28 may not be equivalent to skew angle 30. For example, as shown, skew angle 28 is greater than skew angle 30. This results in an uneven, i.e., an asymmetrically tilted, etch pattern in beam element 20. As shown in FIG. 2, the asymmetrically tilted etch profile of beam element 20 can lead to a shift of the principle axis 32. This shift in the principle axis 32 can cause the in-plane motion of beam element 20 to couple to out-of-plane motion which contributes to quadrature error. The out-of-plane motion is represented by a tilted bi-directional arrow 33 in FIG. 2.

Knowledge of skew angles 28 and 30 in the sidewalls of some MEMS devices, e.g., angular rate sensors, resulting from inadequate dimensional precision during manufacturing can be crucial for understanding the impact of quadrature error in the MEMS devices. When skew angles 28 and 30 are known, they can be added to the geometry of the angular rate sensor model. Numerical simulations can be run on the angular rate sensor model to predict how much quadrature error the angular rate sensor design produces with the given skew angles 28 and 30.

Attempts have been made to directly measure the skew angles of a structure, such as beam element 20 in order to characterize the potential for quadrature error. However, skew angles 28 and 30 are not readily measured directly through cross sectioning since they can be very small. For example, skew angles 28 and 30 can be on the order of 0.2 degrees. Other methodologies entail probing the MEMS device, such as a MEMS angular rate sensor, to determine the severity of quadrature error. However, these methodologies call for vacuum seal of the MEMS device or a specialized probe chamber, and sophisticated measurement capabilities.

Embodiments entail a test apparatus, a test system, and methodology for estimating skew angles in a sidewall of a MEMS device that result from a particular etch process that may be used to fabricate the MEMS device, and fabricating MEMS devices based on the results of the methodology. The test apparatus, test system, and methodology are implemented to estimate sidewall skew angles from a static probe measurement in ambient conditions. The test apparatus design can enable estimation of the sidewall skew angle to within approximately ten percent in any location on a device wafer that the test apparatus is fabricated. Accordingly, results of the test methodology can be evaluated to ascertain the efficacy of a particular etch process and/or to test improvements to an etch process in order to reduce the skew angles to an acceptable range.

The test apparatus, test system, and methodology for estimating the sidewall skew angle may be implemented with a variety of MEMS devices, e.g., angular rate sensors, optical devices, and so forth, where in-plane to out-of-plane coupling (resulting from manufacturing imperfections that permit the suspended mass to move out-of-plane of its intended drive motion) can adversely affect the output and/or operation of the MEMS device.

Figure 3:
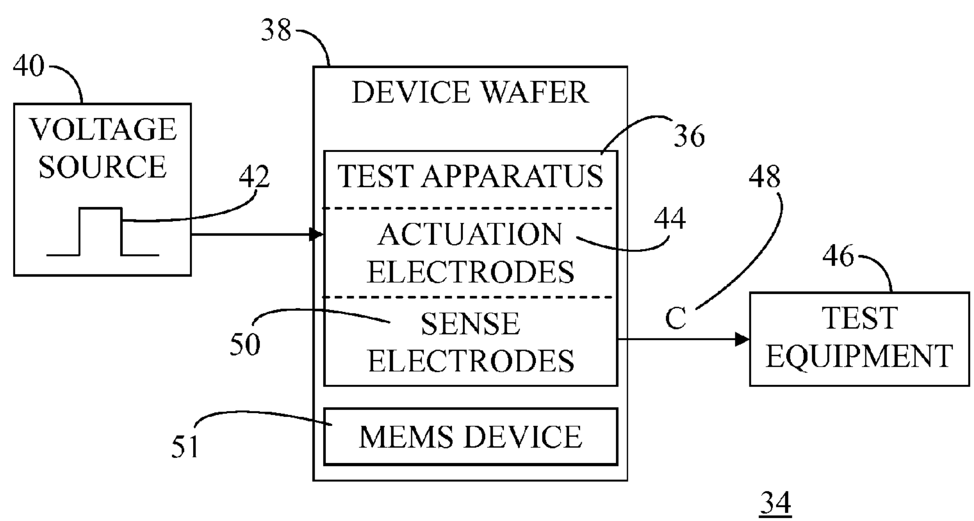
FIG. 3 shows a block diagram of a test system for estimating a skew angle in a sidewall of a beam in accordance with an embodiment.

FIG. 3 shows a block diagram of a test system 34 for estimating a skew angle in a sidewall of a beam formed using an etch process in accordance with an embodiment. In general, test system 34 includes a test apparatus 36 contained on a device wafer 38. Test apparatus 36 may be formed using a particular etch process under evaluation. Test system 34 further includes a voltage source 40 for providing an actuation signal 42, for example, a direct current (DC) voltage signal 42, to actuation electrodes 44 of test apparatus 36. Additionally, test system 34 includes test equipment 46 for receiving signals, for example, a capacitance signal 48 (represented by "C") from sense electrodes 50 of test apparatus 36. For purposes of illustration, capacitance signal 48 is referred to herein as a baseline capacitance signal 48. In accordance with a skew angle evaluation process, a change in capacitance from baseline capacitance signal 48 may be measured, as discussed in greater detail below.

In general, test apparatus 36 includes a mechanical amplification structure (discussed below) that is actuated via voltage source 40. The mechanical amplification structure applies a relatively large amount of in-plane bending to one or more beams. This large static in-plane bending produces out-of-plane motion if the beam has a sidewall skew angle, or more particularly, when asymmetrically tilted etch patterns (shown in FIGS. 1 and 2), are formed in the sidewalls of the beam. The degree of out-of-plane motion is related to the skew angle. Test equipment 46 may be used to measure the vertical motion of the tip of the beam to infer the skew angle. In some embodiments, sense electrodes 50 are capacitive sensors that are formed at some advantageous position proximate the mechanical amplification structure to sense the vertical (i.e., out-of-plane) motion and communicate capacitance signal 48 to test apparatus 36.

Test apparatus 36 includes one or more structures formed on a substrate of device wafer 38 using a particular etch process under evaluation. These one or more structures can be formed at suitable locations on the substrate in order to estimate skew angles resulting from the etch process over a wide surface area of the substrate. Test apparatus 36 is independent from the MEMS devices to be fabricated using the etch process under evaluation. Hence, in some embodiments, device wafer 38 may be a device wafer upon which only test apparatuses 36 are formed. In other embodiments, device wafer 38 may be a device wafer upon which MEMS devices (e.g., angular rate sensors), generally represented by a reference numeral 51, are co-located with one or more test apparatuses 36. However, test apparatuses 36 are located in different physical positions on the substrate from MEMS devices (51).

Figure 4:
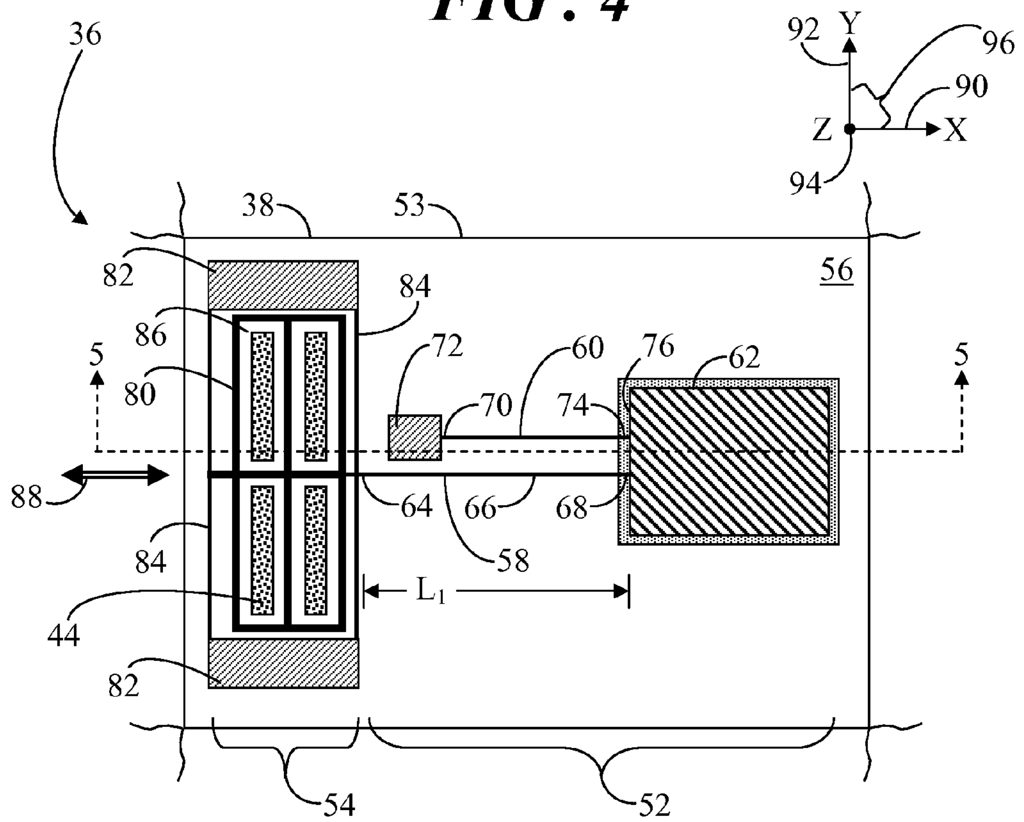
FIG. 4 shows a top view of a test apparatus for estimating a skew angle in accordance with an embodiment.
Figure 5:
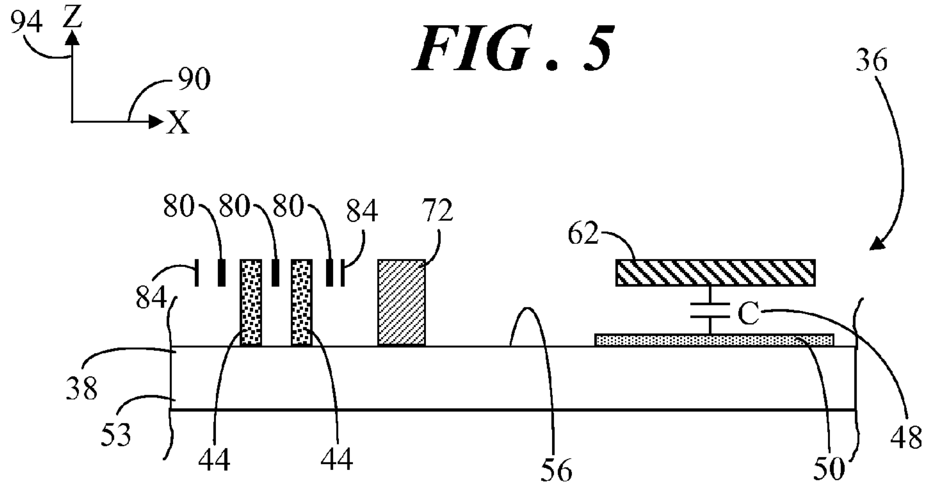
FIG. 5 shows a side view of the test apparatus of FIG. 4.

Referring to FIGS. 4 and 5, FIG. 4 shows a top view of one of test apparatuses 36 for estimating a skew angle in accordance with an embodiment, and FIG. 5 shows a side view of test apparatus 36 along section lines 5-5 of FIG. 4. Test apparatus 36 generally includes a motion amplification structure 52 suspended above a substrate 53, an actuator 54, and at least one sense electrode 50 formed on a planar surface 56 of substrate 53. As mentioned previously, device wafer 38 may contain only test apparatuses 36. Alternatively, device wafer 38 may contain one or more test apparatuses 36 co-located with, but independent from, MEMS devices 51 (FIG. 3) also formed on substrate 53. As such, only a portion of device wafer 38 including one of test apparatuses 36 is shown for simplicity of illustration.

Motion amplification structure 52 includes a first beam 58, a second beam 60, and a paddle element 62. First beam 58 has a first movable end 64, a middle region 66 configured to flex, and a second end 68. Second beam 60 has a third end 70 fixed to substrate 53 via an anchor 72 and a fourth end 74. Second end 68 of first beam 58 and fourth end 74 of second beam 60 are connected to paddle element 62. In an embodiment, first and second beams 58 and 60 are adjacent to one another such that second end 68 of first beam 58 and fourth end 74 of second beam 60 are coupled to a common edge 76 (i.e., the same edge) of paddle element 62. However, in other embodiments, first and second beams 58 and 60 may not be adjacent to one another. Sense electrode 50 is positioned on surface 56 of substrate 53 underlying the suspended paddle element 62.

Various components of test apparatus 36 are illustrated with different shading and/or hatching to distinguish the different elements produced within the structural layers of test apparatus 36 from one another. These different elements within the structural layers may be produced utilizing the surface micromachining techniques of depositing, patterning, etching, and so forth. Accordingly, although different shading and/or hatching is utilized in the illustrations, the different elements within the structural layers are typically formed out of the same material, such as polysilicon, single crystal silicon, and the like.

In addition, the terms "first," "second," "third," "fourth," et cetera used herein do not refer to an ordering or prioritization of elements within a countable series of elements. Rather, the terms "first," "second," "third," and "fourth," are used to distinguish the particular elements for clarity of discussion. The elements of test apparatus 36 may be described variously as being "attached to," "attached with," "coupled to," "connected to," or "interconnected with," other elements of test apparatus 36. However, it should be understood that the terms refer to the direct or indirect physical connections of particular elements of test apparatus 36 that occur during their formation through the deposition, patterning, and etching processes of MEMS fabrication.

Actuator 54 includes a movable element 80 suspended above substrate 53 and coupled to first end 64 of first beam 58. Actuator 54 further includes one or more anchor elements 82 fixed to substrate 53 and compliant members 84 interconnected between movable element 80 and anchor elements 82.

Actuator 54 additionally includes one or more actuation electrodes 44 positioned proximate movable element 80.

In some embodiments, movable element 80 is a frame structure having multiple openings 86, with one of actuation electrodes 44 positioned within each of openings 86. However, movable element 80 and actuation electrodes 44 can vary greatly in other embodiments. For example, in some embodiments, each of openings 86 may include two adjacent actuation electrodes 44 suitably arranged to enable bidirectional actuation. Conductive traces, pads, interconnects, test points, and so forth (not shown) may be formed on, in, or proximate to substrate 53 in a known manner for use in forming an electrically conductive pathway between voltage source 40 (FIG. 3) and actuation electrodes 44.

The cross-sectional side view of test apparatus 36 shown in FIG. 5 reveals the fixed connection of sense electrode 50, anchor 72 (coupled to third end 70 of second beam 60), and actuation electrodes 44 to surface 56 of substrate 53. Additionally, the side view of test apparatus 36 reveals the suspended configuration of paddle element 62, movable element 80, and compliant members 84 above surface 56 of substrate 53. Although not visible in the side view, first and second beams 58 and 60 are suspended above surface 56 of substrate 53 in a similar manner. Test apparatus 36 can be formed using conventional surface micromachining techniques involving sacrificial material deposition, patterning, and etching to achieve the released and suspended structures of beams 58, 60, paddle element 62, movable element 80, and compliant members 84.

As will be discussed in greater detail below, actuation signal 42 (FIG. 3) is applied to actuation electrodes 44. Actuation signal 42 enables motion of movable element 80 relative to fixed anchor elements 82 by electrostatic force. That is, compliant members 84 flex to enable planar motion of movable element 80 toward first beam 58. Since movable element 80 is coupled to first end 64 of first beam 58, the motion of movable element 80 induces an axial force, represented by an arrow 88 in FIG. 1, upon first end 64 of first beam 58.

In the exemplary embodiment, a three-dimensional coordinate system is provided showing an X-axis 90, a Y-axis 92, and a Z-axis 94, where Z-axis 94 is perpendicular to surface 56 of substrate 53. Test apparatus 36 is thus illustrated as having a generally planar structure within an X-Y plane 96, where X-axis 90 and Y-axis 92 are substantially parallel to surface 56 of substrate 53 and Z-axis 94 extends perpendicular to X-Y plane 96.

In the exemplary embodiment, axial force 88 is oriented approximately parallel to X-axis 90, and is thus parallel to planar surface 56. A height of compliant members 84 in a direction parallel to Z-axis 94 is significantly greater than their width in a direction parallel to X-axis 90. Additionally, a length of compliant members 84 in a direction parallel to Y-axis 92 is significantly greater than both the height and width of compliant members 84. Accordingly, compliant members 84 are flexible to allow motion of movable element 80 toward first end 64 of first beam in order to induce axial force 88. However, compliant elements 84 are relatively stiff in a direction perpendicular to surface 56 (i.e., in a direction parallel to Z-axis 94) to prevent or limit electrostatic levitation of movable element 80. Those skilled in the art will recognize that compliant elements 84 can be configured in a great variety of shapes and orientations, and to have any suitable stiffness that enables motion of movable element 80.

When axial force 88 is a compressive axial force which exceeds a critical value, first beam 58 is compressed axially along its length, $L_1$, and the movable first end 64 displaces axially (i.e., in a direction parallel to X-axis 90). Similarly, when axial force 88 is a tensile axial force with exceeds the critical value, first beam 58 is pulled axially (i.e., in a direction parallel to X-axis 90) and again, the movable first end 64 displaces axially. Second end 68 is effectively fixed due to its interconnection with paddle element 62, second beam 60, and anchor 72. Accordingly, the axial displacement of the movable first end 64 of first beam 58 (in response to either a compressive or a tensile axial force 88) can cause middle region 66 of first beam 58, as well as second beam 60, to buckle or flex transversely within X-Y plane 96. This flexion is referred to herein as in-plane motion, where the in-plane motion is approximately parallel to planar surface 56.

Any combination of skew angles in sidewalls 98 (best represented in FIG. 7) of first and/or second beams 58 and 60 resulting from the particular etch process used to form test apparatus 36 can produce displacement of the tip of motion amplification structure 52, namely paddle element 62. The displacement of paddle element 62 is a vertical displacement generally parallel to Z-axis 94. Thus, the displacement of paddle element 62 is referred to herein as out-of-plane motion, where the out-of-plane motion is approximately perpendicular to planar surface 96. The displacement of paddle element 62 is sensed at sense electrode 50 as a capacitance change signal. The magnitude of displacement, i.e., a change in capacitance from baseline capacitance signal 48, corresponds to the degree of the skew angle formed in either or both of sidewalls 98 of first and second beams 58 and 60.

The dual beams 58, 60 and paddle element 62 of motion amplification structure 52 enables a relatively large amount of in-plane motion to one or both beams 58 and 60. This relatively large in-plane motion produces out-of-plane motion of paddle element 62 if beams 58, 60 have a sidewall skew angle resulting from the etch process. The degree of out-of-plane motion is related to the size of the skew angle, and therefore measurement of the vertical motion of paddle element 62 can be used to estimate the skew angle. Accordingly, test apparatus 36 may be utilized within test system 34 to estimate skew angles resulting from an etch process in order to determine whether the etch process is suitable or the etch process needs improvement.

Figure 6:
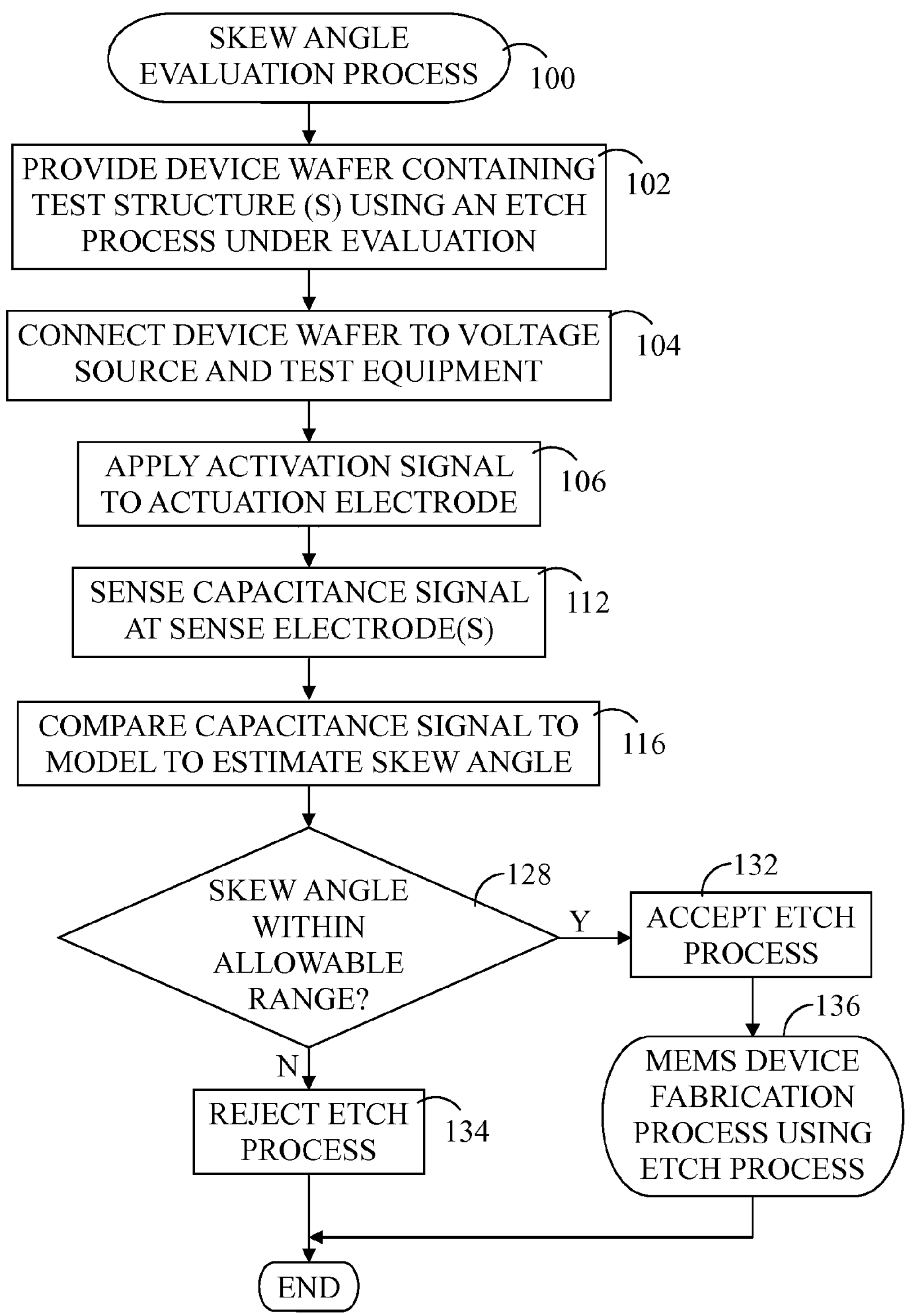
FIG. 6 shows a flowchart of a skew angle evaluation process in accordance with an embodiment.

FIG. 6 shows a flowchart of a skew angle evaluation process 100 utilizing test apparatus 36 (FIG. 4) in accordance with an embodiment. Skew angle evaluation process 100 may be performed utilizing test system 34 (FIG. 3) containing test apparatus 36 (FIG. 4) to estimate a skew angle produced by a particular etch process. The results of the test methodology can evaluated to ascertain the efficacy of a particular etch process and/or to test improvements to an etch process in order to reduce the skew angles to an acceptable range. Thus, MEMS devices 51 (FIG. 3) can be fabricated based on the results of evaluation process 100 when the skew angles are within an acceptable range.

Skew angle evaluation process 100 begins with a task 102. At task 102, a device wafer, e.g., device wafer 38 (FIG. 3), containing at least one of test structures 36 (FIG. 4) is provided. Device wafer 38 is formed using a particular etch process under evaluation. The etch process may be, for example, a deep reactive ion etch (DRIE) process, or any other process implemented to form the suspended structures of MEMS devices 51. In some embodiments, the facility executing skew angle evaluation process 100 may also be the facility that formed device wafer 38. Alternatively, device wafer 38 containing at least one of test structures 36 may be provided by another fabrication facility for evaluation.

Process 100 continues with a task 104. At task 104, device wafer 38 is suitably connected to voltage source 40 (FIG. 3) and test equipment 46 (FIG. 3) within test system 34 (FIG. 3).

Task 104 may be performed in a conventional test environment without the need for test apparatus(es) 36 contained on device wafer 38 to be in a vacuum sealed environment or in a specialized probe chamber.

Following tasks 102 and 104, a task 106 is performed. At task 106, actuation signal 42 (FIG. 3), e.g., a DC bias voltage, is applied to actuation electrodes 44 (FIG. 4).

Figure 7:
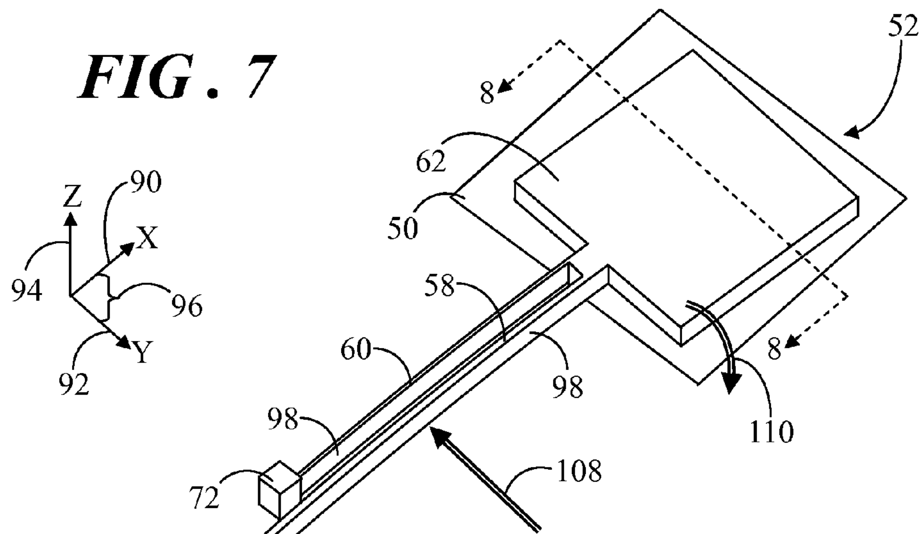
FIG. 7 shows a perspective view of a motion amplification structure implemented within the test apparatus of FIG. 4.
Figure 8:
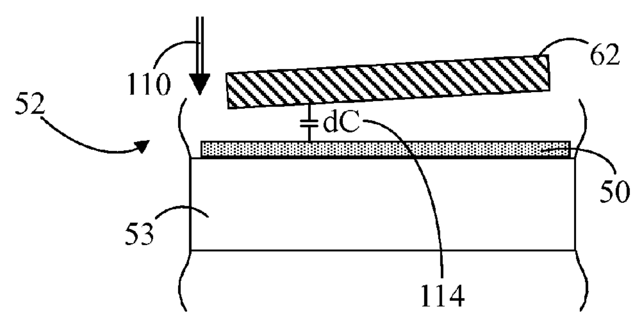
FIG. 8 shows a side view of a portion of the motion amplification structure along section lines 8-8 of FIG. 7.

Referring to FIGS. 7 and 8 in connection with task 106, FIG. 7 shows a perspective view of motion amplification structure 52 implemented within test apparatus 36 (FIG. 4) and FIG. 8 shows a side view of a portion of motion amplification structure 52 along section lines 8-8 of FIG. 7. Application of actuation signal 42 (FIG. 3) induces axial force 88 upon first end 64 of first beam 58 to cause flexion, i.e., in-plane motion 108, of middle region 66 of first beam 58 and potentially second beam 60. In this example, axial force 88 is a tensile axial force. However, in other embodiments, actuation electrodes 44 (FIG. 4) may be configured to generate bidirectional actuation to alternately produce both tensile axial force and compressive axial force. When one or both sidewalls 98 (FIG. 7) of at least first beam 58 exhibit a skew angle relative to Z-axis 94, in-plane motion 108 produces displacement, i.e., out-of-plane motion 110 (FIG. 8) of paddle element 62.

Referring back to FIG. 6 and with continued reference to FIGS. 7 and 8, a task 112 is performed in connection with task 106. At task 112, the displacement, i.e., out-of-plane motion 110, of paddle element 62 is sensed at sense electrodes 50 as a capacitance change signal 114, dC, between paddle element 62 and the underlying sense electrode 50 relative to baseline capacitance value 48 (FIG. 3). Capacitance change signal 114 at sense electrode 50 may be measured using a conventional test probe of test equipment 46 (FIG. 3).

Referring back to FIG. 6, skew angle evaluation process 100 continues with a task 116. At task 116, capacitance change signal 114 is compared to a model of capacitance changes versus skew angles for test apparatus 36 (FIG. 4) to estimate a skew angle for first beam 58.

Figure 9:
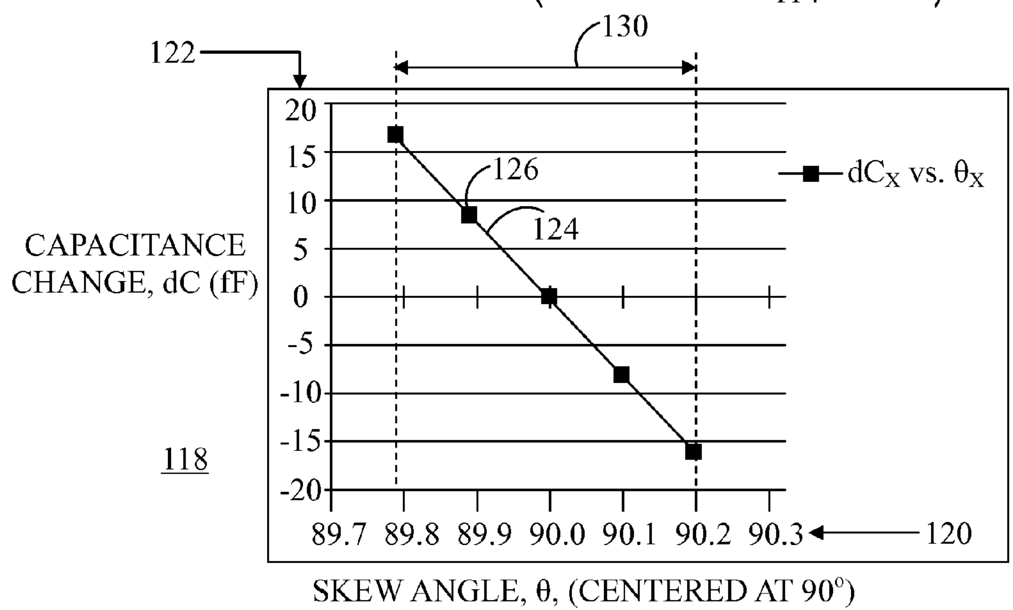
FIG. 9 shows a plot of simulation results that may be utilized to estimate a skew angle.

With reference to FIG. 9 in connection with task 116, FIG. 9 shows a plot 118 of simulation results that may be utilized to estimate a skew angle. In some embodiments, plot 118 includes a horizontal axis of skew angles 120, 0, versus a vertical axis of capacitance change values 122, dC. Skew angles 120 are centered at ninety degrees, where ninety degrees corresponds to the axis perpendicular to planar surface 56 (FIG. 4), i.e., Z-axis 94. Thus, skew angle 120 at ninety degrees corresponds to no skew angle, i.e., a skew angle equal to zero. The capacitance when the skew angle is zero can be any baseline capacitance value 48 (FIG. 3) specific to test apparatus 36. The vertical axis of plot 118 represents a change (i.e., a difference value) between baseline capacitance value 48 and a change in capacitance in response to the displacement, i.e., out-of-plane motion 110, of paddle element 62 (FIG. 4).

In an embodiment, finite element analysis may be utilized to determine a correlation between capacitance change for a particular test apparatus 36 and the skew angle. The skew angle measurement structure, i.e., test structure 36, may be modeled to include one of skew angles 120 and then simulated for in-plane deformations, i.e., in-plane motion 108 (FIG. 7) that correspond to the limits of travel set by the design of test structure 36. Plot 118 indicates the simulation results that form a transfer function 124 between capacitance change 122 and skew angle 120.

The correlation between the capacitance measurements from test structure 36, i.e., capacitance change signal 114 (FIG. 8) and the skew angle on test structure 36, can be determined using plot 118. That is, once capacitance change signal 114 (FIG. 8) is measured at task 112, the measured capacitance change signal 114 can be correlated with skew angles 120 in plot 118 in order to estimate a skew angle of first beam 58 (FIG. 4). By way of example, if the magnitude of capacitance change signal 114 is approximately eight femptofarads, transfer function 124 reveals an estimated skew angle 126 of approximately 0.1 degrees.

With continued reference to FIGS. 6 and 9, following task 116, skew angle evaluation process 100 continues with a query task 128. At query task 128, estimated skew angle 126 is evaluated to determine whether it is within an allowable skew angle range. In this example, a determination is made as to whether estimated skew angle 126 is within an allowable range of skew angles. As shown in plot 118, an allowable range 130 of skew angles 120 may be ±0.2 degrees. When estimated skew angle 126 falls within allowable range 130, process 100 continues with a task 132. At task 132, the etch process used to form test apparatus 36 (FIG. 4) may be accepted for use in producing MEMS devices 51 (FIG. 3).

Accordingly, in response to task 132, a block 136 of process 100 indicates that a MEMS device fabrication process using the accepted etch process is performed to produce the MEMS devices 51. Details of MEMS device fabrication process 136 are not provided in detail herein for brevity. However, it should be understood the same fabrication processes used to fabricate test apparatus 36 may be implemented to fabricate MEMS devices 51. In particular, the same etch process that was evaluated in connection with skew angle evaluation process 100 can be implemented to fabricate MEMS devices 51.

Alternatively, process 100 continues with a task 134 when estimated skew angle 126 falls outside of allowable range 130 as determined at query task 128. At task 134, the etch process used to form test apparatus 36 may be rejected for use in producing MEMS devices 51. That is, the etch process may need improvement in order to get an acceptably reduced skew angle. Following either of tasks 132 and 134, skew angle evaluation process 100 ends.

In some embodiments, estimated skew angle 126 may additionally be added to the geometry of the MEMS device, e.g., angular rate sensor, model. Numerical simulations may then be run to predict how much quadrature error the design produces with estimated skew angle 126. Thus, skew angle evaluation process 100 can be executed to characterize the sidewall skew angle resulting from a particular etch process. If the etch process cannot be improved to reduce the sidewall skew angle, the quadrature error may be too great.

It is to be understood that certain ones of the process blocks depicted in FIG. 6 may be performed in parallel with each other or with performing other processes. In addition, it is to be understood that the particular ordering of the process blocks depicted in FIG. 6 may be modified, while achieving substantially the same result. Accordingly, such modifications are intended to be included within the scope of the inventive subject matter.

Figure 10:
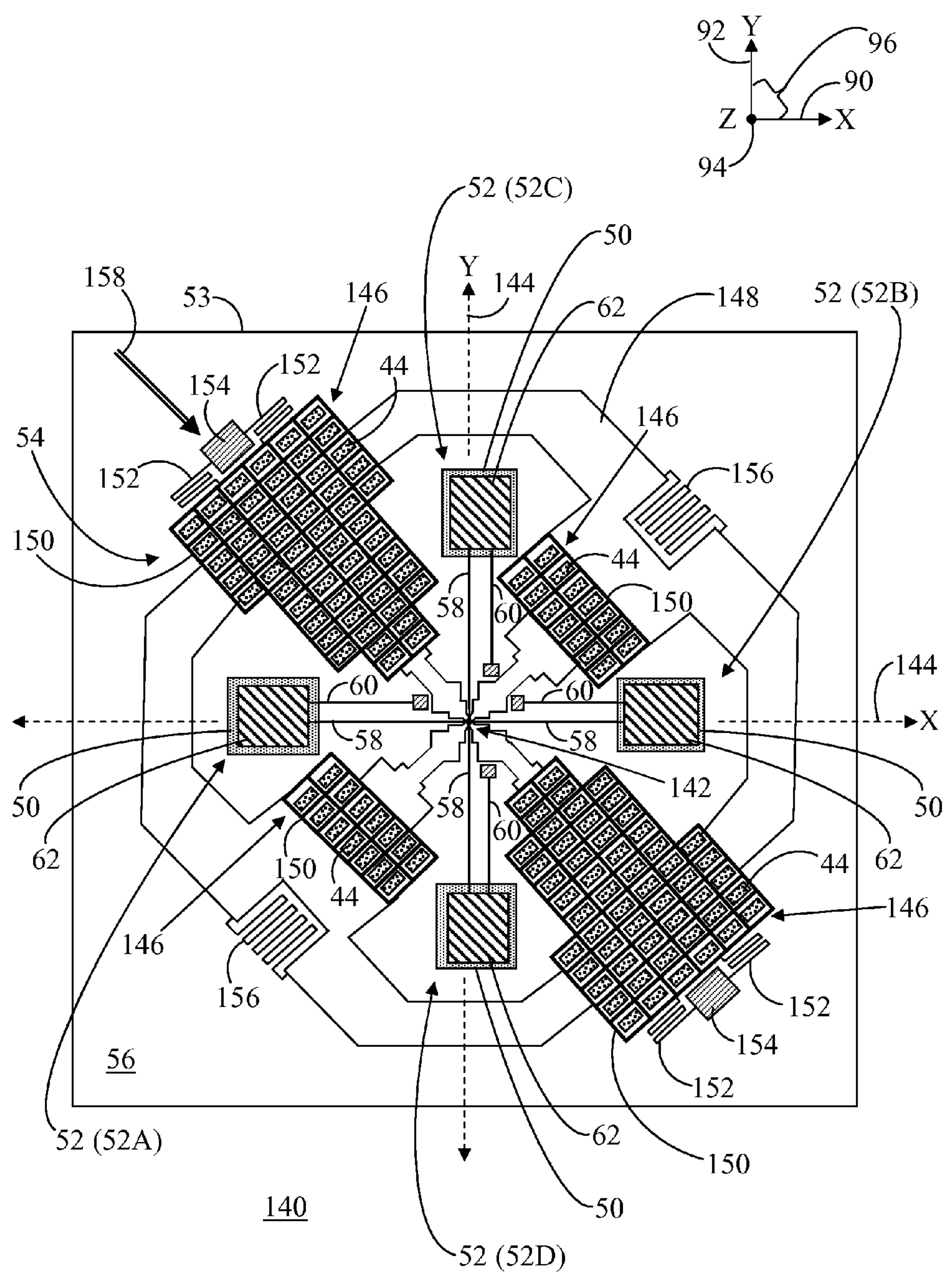
FIG. 10 shows a top view of a test apparatus in accordance with another embodiment.

FIG. 10 shows a top view of a test apparatus 140 in accordance with another embodiment. Test apparatus 140 includes multiple motion amplification structures 52 suspended above surface 56 of substrate 53, where each of the multiple motion amplification structures 52 includes first beam 58, second beam 60, and paddle element 62. In an embodiment, test apparatus 140 further includes a plurality of sense electrodes 50, one each of sense electrodes 50 being in proximity to one each of paddle elements 62. In the illustrated example, sense electrodes are formed on surface 56 of substrate 53 underlying paddle elements 62. Test apparatus 140 employs four motion amplification structures 52 and the corresponding sense electrodes 50 so that test apparatus 140 can evaluate skew angles relative to two axes, i.e., X-axis 90 and Y-axis 92, and so that test apparatus 140 is approximately twice as sensitive to skew angles in each of the two axes.

In an embodiment, test apparatus 140 includes a motion amplification structure 52, referred to herein as a first motion amplification structure 52A, and another motion amplification structure 52, referred to herein as a second motion amplification structure 52B, aligned with first motion amplification structure 52A. Test apparatus 140 further includes a motion amplification structure 52, referred to herein as a third motion amplification structure 52C, and another motion amplification structure 52, referred to herein as a fourth motion amplification structure 52D, aligned with third motion amplification structure 52C. Motion amplification structures 52A, 52B, 52C, and 52D are arranged such that first beams 58 of structures 52A, 52B, 52C, and 52D are connected at a central location 142 of test apparatus 140.

In the illustrated embodiment, each of motion amplification structures 52A, 52B, 52C, and 52D has a longitudinal axis 144 aligned with each respective first beam 58. Longitudinal axis 144 of first and second motion amplification structures 52A and 52B is aligned with an axis that is parallel to planar surface 56 of substrate 53. In particular, longitudinal axis 144 of first and second motion amplification structures 52A and 52B is aligned with, i.e., parallel to, X-axis 90. Similarly, longitudinal axis 144 of third and fourth motion amplification structures 52C and 52D is aligned with an axis that is parallel to planar surface 56 of substrate 53. In particular, longitudinal axis 144 of third and fourth motion amplification structures 52C and 52D is aligned with, i.e., parallel to, Y-axis 92. Thus, third and fourth motion amplification structures 52C and 52D are oriented generally perpendicular to first and second motion amplification structures 52A and 52B.

Test apparatus 140 further includes actuator 54, in the form of four electrode banks 146 that are interconnected by a rigid frame 148. Each of electrode banks 146 includes a movable element 150 and actuation electrodes 44 in proximity to movable element 150, as discussed above in connection with FIG. 4. Compliant members 152 are interconnected between movable element 150 and anchor elements 154 fixed to substrate 53. Additional compliant members 156 may also be furnished to support some of electrode banks 146 of actuator 54.

Movable element 150 of each electrode bank 146 is coupled to first beam 58 of each of motion amplification structures 52A, 52B, 52C, and 52D at central location 142. Actuator 54, containing multiple electrode banks 146 may be activated by the application of actuation signal 42 (FIG. 3) on actuation electrodes 44. In an embodiment, electrode banks 146 may be oriented diagonal to corresponding pairs of motion amplification structures 52A, 52B, 52C, and 52D. Thus, actuation signal 42 enables motion of movable elements 150 of the four electrode banks 146 in a direction 158 that is approximately parallel to X-Y plane 96 and that is approximately diagonal to each of X- and Y-axes 90, 92.

Referring briefly to FIG. 7 in connection with FIG. 10, actuator 54 is operative on each of first beams 58 of motion amplification structures 52A, 52B, 52C, and 52D such that activation of actuator 54 induces at least a portion of axial force 88 upon first ends 64 of first beams 58 to cause in-plane motion 108 of middle regions 66 of first beams 58. That is, the diagonal direction 158 of motion of movable elements 150 imparts a vector portion of axial force 88 upon first ends 64 of first beams 58. As discussed previously, when any of first beams 58 of motion amplification structures 52A, 52B, 52C, and 52D has one or more sidewalls 98 that exhibits a skew angle, flexion of first beam 58 produces displacement of the its corresponding paddle element 62. The displacement of corresponding paddle element 62 is subsequently sensed as capacitance change 114 (FIG. 8) at the corresponding sense electrode 50.

Figure 11:
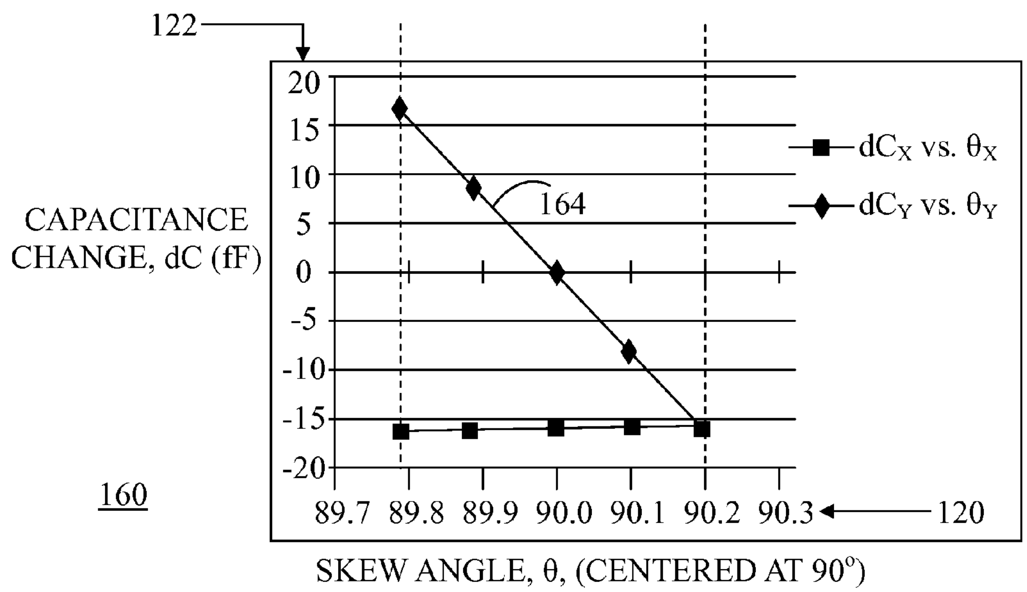
FIG. 11 shows a plot of simulation results that may be utilized to estimate a skew angle in one direction.
Figure 12:
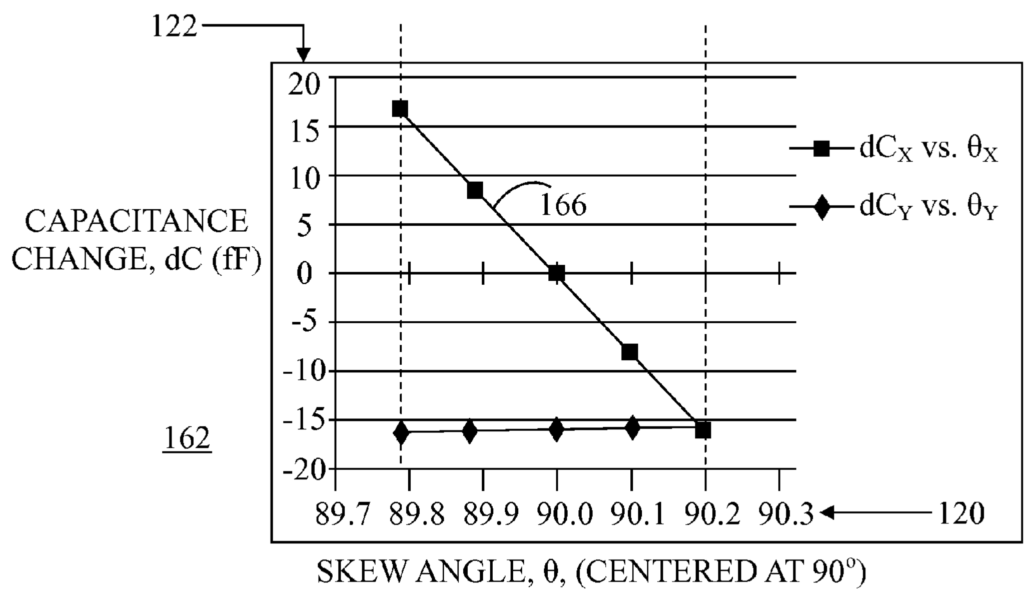
FIG. 12 shows a plot of simulation results that may be utilized to estimate a skew angle in another direction.

Referring to FIGS. 11 and 12, FIG. 11 shows a plot 160 of simulation results that may be utilized to estimate a skew angle in one direction, and FIG. 12 shows a plot 162 of simulation results that may be utilized to estimate a skew angle in another direction. Plots 160 and 162 may be utilized in connection with skew angle evaluation process 100 (FIG. 6) when evaluating skew angles using the dual axis configuration of test apparatus 140 (FIG. 10).

Each of plots 160 and 162 includes a horizontal axis of skew angles 120, 0, versus a vertical axis of capacitance change values 122, dC. As discussed above, skew angles 120 are centered at ninety degrees, where ninety degrees corresponds to the axis perpendicular to planar surface 56 (FIG. 4), i.e., Z-axis 94. The vertical axis in each of plots 160 and 162 represents the change (i.e., a difference value) between baseline capacitance value 48 and a change in capacitance in response to the displacement.

Plot 160 indicates the simulation results that form a transfer function 164 between capacitance change 122 and skew angle 120 for third and fourth motion amplification structures 52C and 52D (FIG. 10) in the Y-direction. Plot 160 further indicates that first and second motion amplification structures 52A and 52B longitudinally aligned with X-axis 90 (FIG. 10) are largely insensitive to sidewall skew angles in the Y direction. Similarly, plot 162 indicates the simulation results that form another transfer function 166 between capacitance change 122 and skew angle 120 for first and second motion amplification structures 52A and 52B (FIG. 10) in the X-direction. Plot 162 further indicates that third and fourth motion amplification structures 52C and 52D longitudinally aligned with Y-axis 92 (FIG. 10) are largely insensitive to sidewall skew angles in the X direction.

Thus, various embodiments of a test apparatus, a test system, and a methodology have been described for estimating skew angles in a sidewall of a MEMS device that result from a particular etch process used to fabricate the MEMS device. An embodiment of a test apparatus comprises a motion amplification structure suspended above a substrate. The motion amplification structure includes a first beam, a second beam, and a paddle element. The first beam has a movable first end, a middle region configured to flex, and a second end. The second beam has a third end fixed to the substrate and a fourth end, wherein the second end of the first beam and the fourth end of the second beam are connected to the paddle element. The test apparatus further comprises an actuator operative upon the first beam such that activation of the actuator induces an axial force upon the first end of the first beam to cause flexion of the middle region, and a sense electrode in proximity to the paddle element, wherein when a sidewall of the first beam exhibits a skew angle relative to an axis perpendicular to a planar surface of the substrate, the flexion of the first beam produces displacement of the paddle element, the displacement of the paddle element being sensed at the sense electrode.

An embodiment of test system for estimating a skew angle in a sidewall of a beam formed using an etch process comprises a test apparatus formed on a substrate using the etch process. The test apparatus includes a motion amplification structure suspended above the substrate, the motion amplification structure including a first beam, a second beam, and a paddle element. The first beam has a movable first end, a middle region configured to flex, and a second end. The second beam has a third end fixed to the substrate and a fourth end, wherein the second end of the first beam and the fourth end of the second beam are connected to the paddle element. The test apparatus further includes an actuator operative upon the first beam such that activation of the actuator induces axial force upon the first end of the first beam to cause flexion of the middle region, and a sense electrode in proximity to the paddle element, wherein when the first beam exhibits the skew angle, the flexion of the first beam produces displacement of the paddle element, the displacement of the paddle element being sensed at the sense electrode. The test system further includes test equipment in communication with the sense electrode for receiving a signal indicative of the displacement of the paddle element, wherein the skew angle defines a degree to which the sidewall of the first beam is offset from an axis perpendicular to a planar surface of the substrate, and the displacement corresponds to the degree of the sidewall skew angle.

An embodiment of a method comprises providing device wafer containing a test apparatus, the test apparatus including a motion amplification structure suspended above a substrate of the device wafer, the motion amplification structure including a first beam, a second beam, and a paddle element, the first beam having a movable first end, a middle region configured to flex, and a second end, the second beam having a third end fixed to the substrate and a fourth end, wherein the second end of the first beam and the fourth end of the second beam are connected to the paddle element. The method further comprises inducing an axial force upon the first end of the first beam via an actuator to cause flexion of the middle region and determining a displacement of the paddle element in response to the axial force.

Another embodiment of a method comprises providing a device wafer containing a test apparatus, the test apparatus including a motion amplification structure suspended above a substrate of the device wafer, the motion amplification structure including a first beam, a second beam, and a paddle element, wherein an etch process is used to produce the motion amplification structure, the first beam having a movable first end, a middle region configured to flex, and a second end, the second beam having a third end fixed to the substrate and a fourth end, the second end of the first beam and the fourth end of the second beam being connected to the paddle element. The method further comprises inducing an axial force upon the first end of the first beam to cause flexion of the middle region, determining a displacement of the paddle element in response to the axial force, and estimating a skew angle of a sidewall of the first beam in response to the displacement, the skew angle resulting from the etch process, and the skew angle defining a degree to which the sidewall of the first beam is nonparallel to an axis perpendicular to a planar surface of the substrate. When the estimated skew angle is outside of an allowable skew angle range, the etch process is rejected for use in fabricating the MEMS device. When the estimated skew angle is within the allowable skew angle range, the etch process is accepted for use in fabricating the MEMS device and the MEMS device is fabricated using the etch process.

The test apparatus, test system, and methodology are implemented to estimate sidewall skew angles from a static probe measurement in ambient conditions. The test apparatus design can enable estimation of the sidewall skew angle to within approximately ten percent in any location on a device wafer that the test apparatus is fabricated. Accordingly, results of the test methodology can be evaluated to ascertain the efficacy of a particular etch process and/or to test improvements to an etch process in order to reduce the skew angles to an acceptable range. Although particular test apparatus and test system configurations are described in conjunction with FIGS. 1-5 and 7-12, above, embodiments may be implemented in systems having other architectures, as well. These and other variations are intended to be included within the scope of the inventive subject matter.

While the principles of the inventive subject matter have been described above in connection with specific apparatus, systems, and methods, it is to be clearly understood that this description is made only by way of example and not as a limitation on the scope of the inventive subject matter. The various functions or processing blocks discussed herein and illustrated in the Figures may be implemented in hardware, firmware, software or any combination thereof. Further, the phraseology or terminology employed herein is for the purpose of description and not of limitation.

The foregoing description of specific embodiments reveals the general nature of the inventive subject matter sufficiently so that others can, by applying current knowledge, readily modify and/or adapt it for various applications without departing from the general concept. Therefore, such adaptations and modifications are within the meaning and range of equivalents of the disclosed embodiments. The inventive subject matter embraces all such alternatives, modifications, equivalents, and variations as fall within the spirit and broad scope of the appended claims.

What is claimed is:

1. An apparatus comprising:

a motion amplification structure suspended above a substrate, said motion amplification structure including a first beam, a second beam, and a paddle element, said first beam having a movable first end, a middle region configured to flex, and a second end, said second beam having a third end fixed to said substrate and a fourth end, wherein said second end of said first beam and said fourth end of said second beam are connected to said paddle element;

an actuator operative upon said first beam such that activation of said actuator induces an axial force upon said first end of said first beam to cause flexion of said middle region, wherein said actuator comprises:

a movable element suspended above said substrate and coupled to said first beam; anchor elements fixed to said substrate;

compliant members interconnected between said movable element and said anchor elements; and at least one actuation electrode coupled to said substrate and positioned proximate said movable element, wherein an actuation signal applied to said at least one actuation electrode enables motion of said movable element relative to said anchor elements to induce said axial force upon said first end of said first beam; and a sense electrode in proximity to said paddle element, wherein when a sidewall of said first beam exhibits a skew angle relative to an axis perpendicular to a planar surface of said substrate, said flexion of said first beam produces displacement of said paddle element, said displacement of said paddle element being sensed at said sense electrode.

2. An apparatus as claimed in claim 1 wherein said skew angle defines a degree to which said sidewall of said first beam is nonparallel to said axis.

3. An apparatus as claimed in claim 2 wherein said displacement of said paddle element corresponds to said degree of said skew angle.

4. An apparatus as claimed in claim 1 wherein:

said flexion of said first beam in response to said axial force is an in-plane motion of said first beam, said in-plane motion being approximately parallel to said planar surface; and said displacement of said paddle element is an out-of-plane motion of said paddle element, said out-of-plane motion being approximately perpendicular to said planar surface.

5. An apparatus as claimed in claim 4 wherein said sense electrode is positioned on said planar surface of said substrate underlying said paddle element for detecting said out-of-plane motion of said paddle element.

6. An apparatus as claimed in claim 1 wherein said first and second beams are adjacent to one another such that said second end of said first beam and said fourth end of said second beam are coupled to a common edge of said paddle element.

7. An apparatus as claimed in claim 1 wherein said compliant members are stiff in a direction perpendicular to a planar surface of said substrate.

8. An apparatus as claimed in claim 1 further comprising:

multiple motion amplification structures suspended above said substrate, each of said motion amplification structures including said first beam, said second beam, and said paddle element; and a plurality of sense electrodes, one each of said sense electrodes being in proximity to one each of said paddle element.

9. An apparatus as claimed in claim 8 wherein said multiple motion amplification structures include:

a first motion amplification structure;

a second motion amplification structure aligned with said first amplification structure;

a third motion amplification structure; and a fourth motion amplification structure aligned with said third amplification structure, wherein said first, second, third, and fourth motion amplification structures are arranged such that said first beam of each of said first, second, third, and fourth motion amplification structures is connected at a central location of said apparatus.

10. An apparatus as claimed in claim 9 wherein:

each of said first, second, third, and fourth motion amplification structures has a longitudinal axis aligned with said first beam;

said longitudinal axis of each of said first and second motion amplification structures is aligned with a first axis that is approximately parallel to a planar surface of said substrate;

said longitudinal axis of each of said third and fourth motion amplification structures is aligned with a second axis that is approximately parallel to said planar surface and perpendicular to said first axis; and said actuator includes a movable element coupled to each said first beam of said first, second, third, and fourth motion amplification structures, wherein an actuation signal applied by said actuator enables motion of said movable element in a direction that is approximately parallel to said planar surface and diagonal to each of said first and second axes, to induce said axial force upon said first end of said first beam of each of said first, second, third, and fourth motion amplification structures.

11. An apparatus as claimed in claim 9 wherein:

said actuator is operative upon each said first beam such that activation of said actuator induces said axial force upon each said first end of said each first beam to cause flexion of each said middle region; and when any of said each first beam has a sidewall that exhibits said skew angle, said flexion of said each first beam produces displacement of a connected said paddle element, said displacement of said paddle element being sensed at an associated one of said sense electrodes.

12. A method comprising:

providing a device wafer containing a test apparatus, said test apparatus including a motion amplification structure suspended above a substrate of said device wafer, said motion amplification structure including a first beam, a second beam, and a paddle element, said first beam having a movable first end, a middle region configured to flex, and a second end, said second beam having a third end fixed to said substrate and a fourth end, wherein said second end of said first beam and said fourth end of said second beam are connected to said paddle element;

inducing an axial force upon said first end of said first beam to cause flexion of said middle region; and determining a displacement of said paddle element in response to said axial force, wherein said flexion of said first beam in response to said axial force is an in-plane motion of said first beam, said in-plane motion being approximately parallel to a planar surface of said substrate, and when a sidewall of said first beam exhibits a skew angle relative to an axis perpendicular to said planar surface, said flexion of said first beam produces said displacement of said paddle element, said displacement of said paddle element being an out-of-plane motion of said paddle element, said out-of-plane motion being approximately perpendicular to said planar surface.

13. A method comprising:

providing a device wafer containing a test apparatus, said test apparatus including a motion amplification structure suspended above a substrate of said device wafer, said motion amplification structure including a first beam, a second beam, and a paddle element, said first beam having a movable first end, a middle region configured to flex, and a second end, said second beam having a third end fixed to said substrate and a fourth end, wherein said second end of said first beam and said fourth end of said second beam are connected to said paddle element, wherein an etch process is used to produce said first beam;

inducing an axial force upon said first end of said first beam to cause flexion of said middle region;

determining a displacement of said paddle element in response to said axial force; and estimating a skew angle of a sidewall of said first beam in response to said displacement, said skew angle resulting from said etch process, and said skew angle defining a degree to which said sidewall of said first beam is non-parallel to an axis perpendicular to a planar surface of said substrate.

14. A method as claimed in claim 13 wherein:

said displacement is characterized by a capacitance change between a sense element and said paddle element relative to a baseline capacitance value, said baseline capacitance value being indicative of a zero degree skew angle; and said estimating operation comprises comparing said capacitance change to a model of capacitance changes versus skew angles for said test apparatus to estimate said skew angle for said first beam.

15. A method as claimed in claim 13 further comprising rejecting said etch process for use in fabricating a microelectromechanical systems (MEMS) device when said estimated skew angle is outside of an allowable skew angle range.

16. A method as claimed in claim 13 further comprising accepting said etch process for use in fabricating a microelectromechanical systems (MEMS) device when said estimated skew angle is within an allowable skew angle range.

* * * * *